United States Patent
Kawaguchi et al.

(10) Patent No.: US 10,798,861 B2
(45) Date of Patent: Oct. 6, 2020

(54) MOUNTER

(71) Applicant: FUJI CORPORATION, Chiryu-shi (JP)

(72) Inventors: Koji Kawaguchi, Kasugai (JP); Kohei Sugihara, Nishio (JP); Yoji Fujita, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 289 days.

(21) Appl. No.: 15/772,667

(22) PCT Filed: Nov. 6, 2015

(86) PCT No.: PCT/JP2015/081344
§ 371 (c)(1),
(2) Date: May 1, 2018

(87) PCT Pub. No.: WO2017/077645
PCT Pub. Date: May 11, 2017

(65) Prior Publication Data
US 2019/0159373 A1  May 23, 2019

(51) Int. Cl.
| | | |
|---|---|---|
| *B23P 19/00* | (2006.01) | |
| *H05K 13/08* | (2006.01) | |
| *H05K 13/04* | (2006.01) | |
| *H05K 3/30*  | (2006.01) | |

(52) U.S. Cl.
CPC ............ *H05K 13/087* (2018.08); *H05K 3/30* (2013.01); *H05K 13/0409* (2018.08);
(Continued)

(58) Field of Classification Search
CPC .............. H05K 13/08; H05K 13/0815; H05K 13/0404; H05K 13/0411; H05K 13/0069;
(Continued)

(56) References Cited

U.S. PATENT DOCUMENTS

| | | | | |
|---|---|---|---|---|
| 7,966,718 B2* | 6/2011 | Kodama | ................ | H05K 3/305 29/739 |
| 9,204,586 B2* | 12/2015 | Kato | ................... | H05K 13/0452 |
| 2006/0085973 A1 | 4/2006 | Kodama et al. | | |

FOREIGN PATENT DOCUMENTS

| | | |
|---|---|---|
| JP | 11-145697 A | 5/1999 |
| JP | 2001-119197 A | 4/2001 |

(Continued)

OTHER PUBLICATIONS

Extended European Search Report dated Oct. 12, 2018 in European Patent Application No. 15907831.0, 9 pages.

(Continued)

*Primary Examiner* — Thiem D Phan
(74) *Attorney, Agent, or Firm* — Oblon, McClelland, Maier & Neustadt, L.L.P.

(57) ABSTRACT

A mounter capable of curtailing interference between a mounting head that has a component holding section, and an exchange-use component holding section and a storage section that holds the exchange-use component holding section. A controller of the mounter reads head identification information for identifying the mounting head from the mounting head. Also, different quantities of protruding sections are formed on nozzle tray in accordance with the height in the Z-axis direction. Also, pressure switches that are pressed by protruding sections so as to turn on and off are provided on loading plate on which nozzle tray is loaded. By this, the controller is able to determine whether interference will occur between the mounting head and nozzle tray based on the detection signal of the pressure switches before the mounting head is moved.

6 Claims, 7 Drawing Sheets

(52) U.S. Cl.
CPC .............. *H05K 13/0413* (2013.01); *H05K 2201/09927* (2013.01); *Y10T 29/53174* (2015.01)

(58) Field of Classification Search
CPC ......... H05K 13/0406; H05K 13/0417; H05K 13/02; H05K 13/04; H05K 13/0409; H05K 13/0419; H05K 2201/09927; H05K 3/30; Y10T 29/53174; Y10T 29/53178; Y10T 29/4913; Y10T 29/53191; Y10T 29/53261; G05B 19/4183; G06T 2207/10004; G06T 2207/30141; H04N 5/2253; H04N 7/183; Y10S 269/903
USPC ......... 29/739, 564, 740, 741, 743, 829, 832, 29/834
See application file for complete search history.

(56) References Cited

FOREIGN PATENT DOCUMENTS

| | | |
|---|---|---|
| JP | 2003-69289 A | 3/2003 |
| JP | 2004-221518 A | 8/2004 |
| JP | 2004-311599 A | 11/2004 |
| JP | 2009-272651 A | 11/2009 |
| JP | 2009-283952 A | 12/2009 |
| JP | 2010-34571 A | 2/2010 |

OTHER PUBLICATIONS

International Search Report dated Feb. 2, 2016, in PCT/JP2015/081344 filed Nov. 6, 2015.

\* cited by examiner

MOUNTER

TECHNICAL FIELD

The present application relates to storage section for storing exchange-use component holding sections in a mounter that holds and mounts components on a board using a component holding section of a mounting head.

BACKGROUND ART

For example, there are mounters that mount electronic components (hereinafter also referred to simply as "components") onto a board by mounting a component picked up by a suction nozzle of a mounting head at a specified position on a board. Such mounters exchange a mounting head or a suction nozzle attached to a mounting head in accordance with the type of board that is the work target. Conventionally, there are mounters that store exchange-use suction nozzles in a nozzle tray arranged on a nozzle station (for example, patent literature 1). With a mounter disclosed in patent literature 1, a suction nozzle in a nozzle tray (referred to in the patent literature as an exchange-use holding member loading section) provided in a nozzle station is exchanged with a suction nozzle that is in use in accordance with the type of board and the like.

Also, the nozzle tray disclosed in patent literature 1 is configured to be removably attached with respect to the mounter. A user can exchange multiple suction nozzles at once by removing the entire nozzle tray and inserting another nozzle tray. Also, an identification mark for identifying the type of the nozzle tray is provided on the nozzle tray. In the mounter, an imaging device is provided on the moving device that moves the mounting head. The mounter uses the imaging device to capture an image of the nozzle tray identification mark, and determines the type of the nozzle tray by processing the captured image data.

CITATION LIST

Patent Literature

Patent literature 1: JP-A-2003-69289

BRIEF SUMMARY

Technical Problem

However, in the above mounter, reducing the movement distance of the mounting head during mounting work is linked to a reduction in work time and thus to a reduction in board production time. Accordingly, with this type of mounter, it is desirable to reduce as much as possible the movement distance when raising and lowering the mounting head in a vertical direction. The movement distance when raising and lowering the mounting head is able to be smaller due to recent components becoming smaller and thinner.

Similarly, mounting heads are raised and lowered in a vertical direction when exchanging suction nozzles at a nozzle tray. In this case too, from the viewpoint of reducing work time, it is desirable to make the movement distance in the vertical direction shorter. However, the shape and size of the above mounting head, nozzle tray, and suction nozzle are different depending on the type. Therefore, for example, if an incorrect combination of mounting head and nozzle tray is attached to the mounter, the mounting head and the nozzle tray may interfere during exchange work.

The present disclosure takes account of such circumstances. An object of the present disclosure is to provide a mounter capable of curtailing interference between a mounting head that has a component holding section, and an exchange-use component holding section and a storage section that holds the exchange-use component holding section.

Solution to Problem

To solve the above problems, a mounter of the present disclosure includes: a mounting head configured to mount components on a board; head identification information provided on the mounting head, the head identification information being for identifying a type of the mounting head; a component holding section configured to hold the component and exchangeably attached to the mounting head; a storage section configured to store an exchange-use component holding section; a base section on which the storage section is removably loaded; and a detection section configured to detect information in accordance with a height of at least one of the exchange-use component holding section and the storage section loaded on the base section.

Advantageous Effects

In a mounter of the present disclosure, head identification information for identifying a type of the mounting head is provided on the mounting head. Also, a storage section stores an exchange-use component holding section to be exchanged with a component holding section attached to the mounting head. A detection section detects information in accordance with a height of the storage section or the like. Thus, the mounter is able to detect the height information at a stage at which the storage section is mounted on the base section or at a fixed period after which the storage section is mounted, which is a stage before the mounting head is moved in order to exchange the component holding section. Also, the mounter is able to determine whether the mounting head and the storage section will interfere based on the head identification information and the information detected by the detection section.

DESCRIPTION OF EMBODIMENTS

A component mounter that is an embodiment of the present disclosure is described below with reference to the figures.

Configuration of Component Mounter

Figure 1:
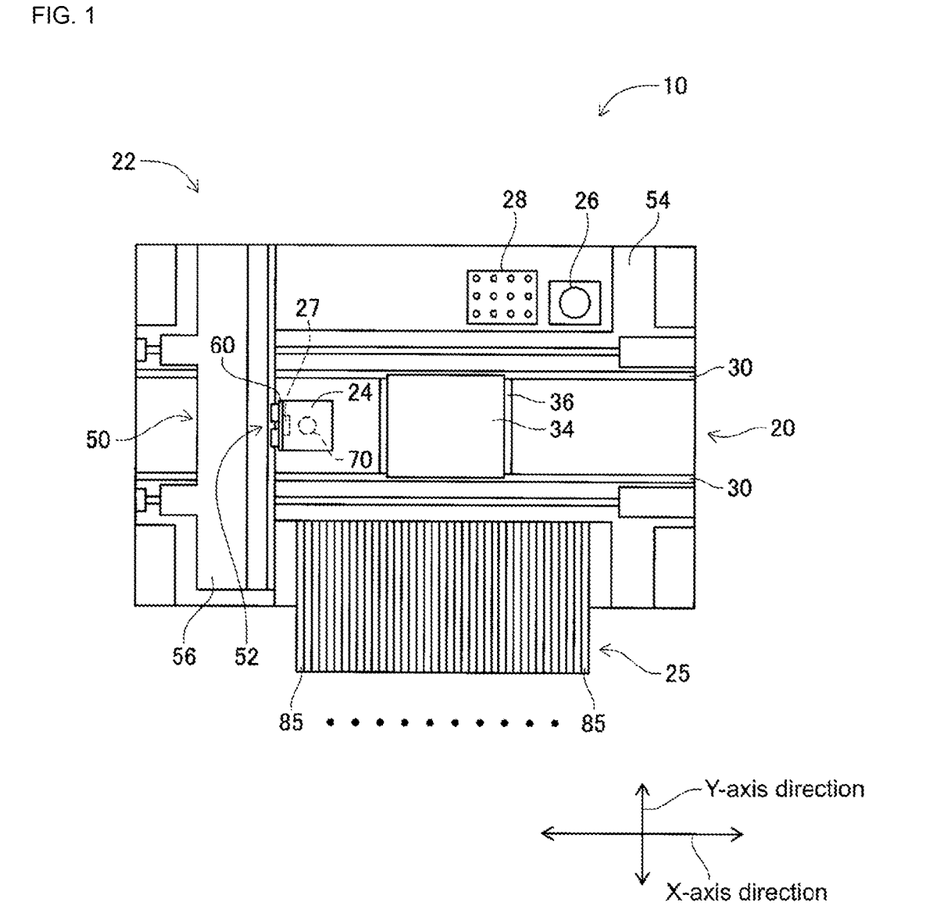
FIG. 1 is a plan view of a component mounter of an embodiment.
Figure 3:
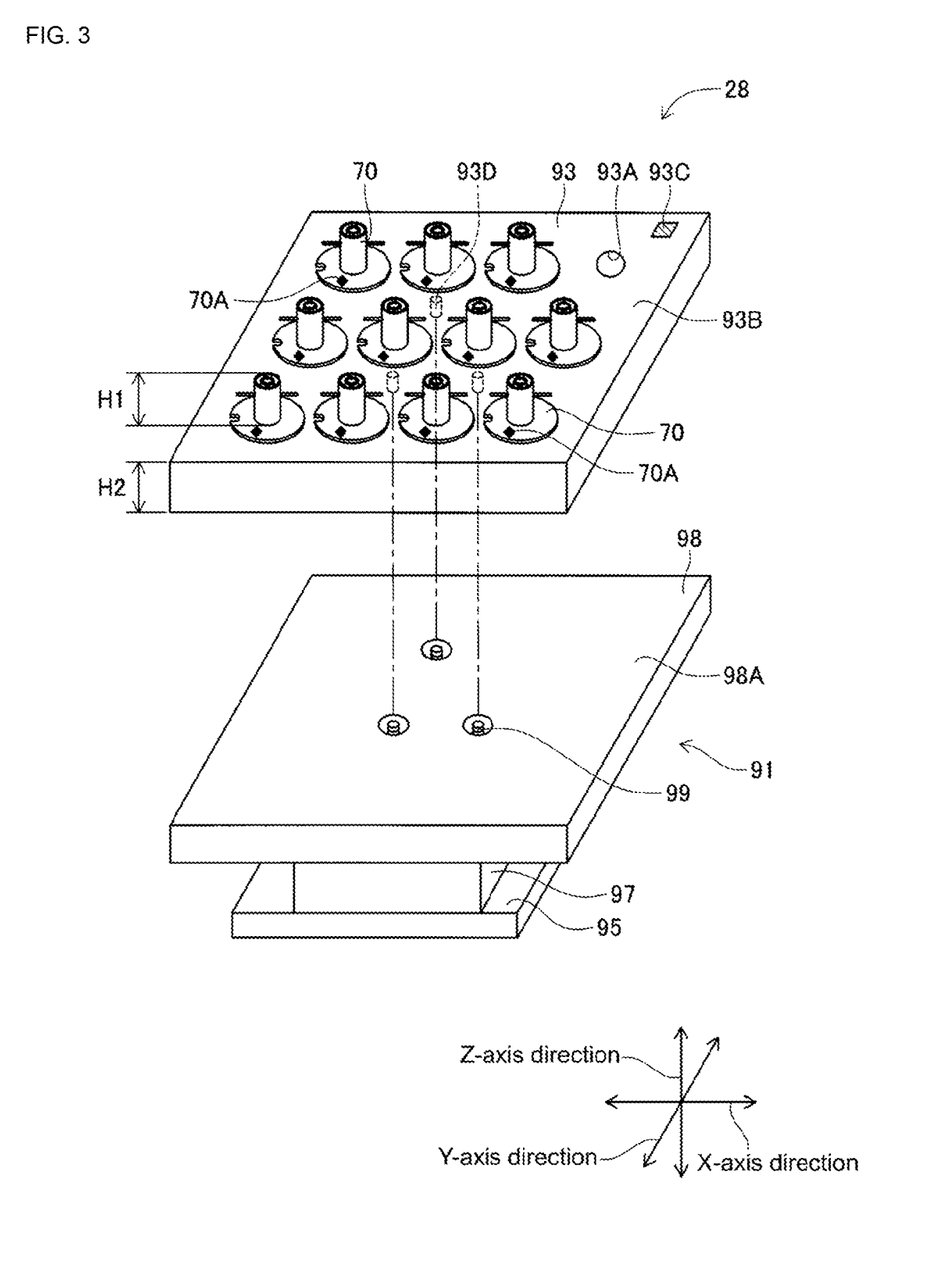
FIG. 3 is a perspective view schematically showing a tray raising and lowering device and a nozzle tray of a nozzle station.

FIG. 1 shows component mounter (hereinafter also referred to simply as "mounter") 10 that is an embodiment of the present disclosure. Mounter 10 is a device for performing work of mounting components on board 34. Mounter 10 is provided with conveyance device 20, mounting head moving device (hereinafter also referred to simply as "moving device") 22, mounting head 24, supply device 25, component camera 26, mark camera 27, and nozzle station 28. Note that, in descriptions below, as shown in FIG. 1, the X-axis direction refers to the direction in which board 34 is conveyed, and the Y-axis direction is a direction parallel to the surface of board 34 that is perpendicular to the X-axis direction. Also, as shown in FIG. 3, the Z-axis direction (the direction perpendicular to the page in FIG. 1) is the direction perpendicular to the X-axis direction and the Y-axis direction.

Conveyance device 20 has a pair of conveyor belts 30 that extend in the X-axis direction, and electromagnetic motor (refer to FIG. 4) 32 that moves conveyor belts 30. Board 34 is supported by this pair of conveyor belts 30 and is conveyed in the X-axis direction by the driving of electromagnetic motor 32. Also, conveyance device 20 includes board holding device 36. Board holding device 36 fixedly holds board 34 supported by conveyor belts 30 in a predetermined position (for example, the position at which board 34 is shown in FIG. 1).

Moving device 22 is configured from X-axis direction sliding mechanism 50 and Y-axis direction sliding mechanism 52. X-axis direction slide mechanism 50 has X-axis slider 56 provided on base 54 so as to be movable in the X-axis direction. X-axis slider 56 is moved to any position in the X-axis direction by the driving of electromagnetic motor (refer to FIG. 4) 58. In addition, Y-axis direction slide mechanism 52 has Y-axis slider 60 provided on a side surface of X-axis slider 56 so as to be movable in the Y-axis direction. Y-axis slider 60 is moved to any position in the Y-axis direction by the driving of electromagnetic motor (refer to FIG. 4) 62. Mounting head 24 is attached to Y-axis slider 60. According to such a structure, mounting head 24 is moved to any position on base 54 in the X-axis direction and the Y-axis direction by moving device 22.

Figure 2:
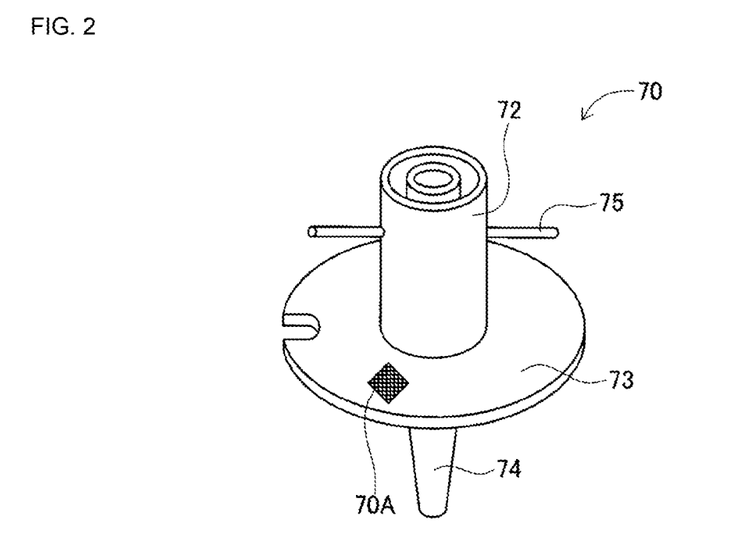
FIG. 2 is a perspective view of a suction nozzle.

Mounting head 24 is for mounting components on board 34. Suction nozzle 70 is attached to a lower surface of mounting head 24. Suction nozzle 70, for example, as shown in FIG. 2, includes body pipe 72, flange 73, suction tube 74, and locking pin 75. Note that, the shape and so on of suction nozzle 70 shown in FIG. 2 is one example of a suction nozzle.

Body pipe 72 is a cylindrical pipe. Flange 73 is roughly a disc-shaped plate, and is fixed to a lower end of body pipe 72 extending outwards from the circumferential surface of body pipe 72. Nozzle identification mark 70A for identifying suction nozzle 70 is provided on an upper surface of flange 73. Nozzle identification mark 70A is, for example, a 2D code. Note that, nozzle identification mark 70A may be any information that allows suction nozzle 70 to be individually identified, for example, a barcode or a number. Suction tube 74 is a narrow pipe that is held in a state extending downwards from the lower end of body pipe 72. Locking pin 75 extends from the outer circumferential surface of the upper end of body pipe 72 towards the outside in the diameter direction. Suction nozzle 70 is attached to mounting head 24 using locking pin 75 such that suction nozzle 70 is attachable and detachable with one touch.

Also, suction nozzle 70 is connected to positive and negative pressure supply device (refer to FIG. 4) 76 via a negative pressure air and positive pressure air supply passage. Suction nozzle 70 picks up and holds a component at the tip of suction tube 74 using negative pressure, and releases the held component using positive pressure. Also, mounting head 24 has nozzle raising and lowering device (refer to FIG. 4) 77 that raises and lowers suction nozzle 70. Mounting head 24 drives nozzle raising and lowering device 77 to change the position in the Z-axis direction of the component held by suction nozzle 70. Further, mounting head 24 includes nozzle rotating device 78 (refer to FIG. 4) that rotates suction nozzle 70 on its own axis. Mounting head 24 drives nozzle rotating device 78 to change the orientation of the component held by suction nozzle 70.

Also, as shown in FIG. 1, supply device 25 is a feeder-type supply device including multiple tape feeders 85. Tape feeder 85 houses taped components in a wound state. Taped components are components that have been put into tape. Tape feeder 85 feeds the taped components using feeding device 86 (refer to FIG. 4). By this, feeder-type supply device 25 supplies an electronic component to a supply position by feeding the taped components. Note that, tape feeder 85 is removably attached to base 54 so as to accommodate exchanging of components, component shortages, and the like.

Component camera 26 is attached to base 54 in a state facing up. Mounter 10 moves mounting head 24 above component camera 26 and images the component held by suction nozzle 70 using component camera 26. Also, mark camera 27 is fixed to Y-axis slider 60 of moving device 22 in a state facing down, and can be moved to any position by operation of moving device 22. Thus, mark camera 27 is able to image any position on base 54.

Nozzle station 28 is provided at a position adjacent to component camera 26 of base 54. FIG. 3 schematically shows a portion of mounter 10 at which nozzle station 28 is provided. Nozzle station 28 includes tray raising and lowering device 91 and nozzle tray 93. Tray raising and lowering device 91 includes base section 95, raising and lowering mechanism 97, and loading plate 98. Base section 95 is fixed to base 54 of mounter 10 (refer to FIG. 1). Raising and lowering mechanism 97, for example, includes an air cylinder that is driven by control device 100 (refer to FIG. 4). Raising and lowering mechanism 97 drives the air cylinder in accordance with control of control device 100 to raising and lower loading plate 98 in the Z-axis direction. Loading plate 98 is formed as a plate, and nozzle tray 93 is loaded on the top side loading surface 98A.

Nozzle tray 93, for example, is formed as a thin plate and is configured to be removably attached to loading plate 98. Nozzle tray 93 includes multiple loading holes 93A formed to pierce nozzle tray 93 in the Z-axis direction. Suction nozzles 70 are housed in the multiple (only one is shown in FIG. 3) loading holes 93A. Suction nozzle 70 is stored in nozzle tray 93 in a state with suction tube 74 inserted into loading hole 93A and the lower surface of flange 73 contacting upper surface 93B of nozzle tray 93.

A user is able to collect suction nozzles 70 or replenish suction nozzles 70 to nozzle tray 93 by performing exchange and so on of nozzle tray 93. Mounting head 24 performs exchange and the like of suction nozzle 70 attached to mounting head 24 and suction nozzle 70 housed in nozzle tray 93.

Also, tray identification mark 93 for identifying nozzle tray 93 is provided on upper surface 93B of nozzle tray 93. Tray identification mark 93C is, for example, a 2D code. Note that, tray identification mark 93C may be any information that allows nozzle tray 93 to be individually identified, for example, a barcode or a number.

Also, protruding section 93D that protrudes down is provided on a lower surface of nozzle tray 93. Protruding section 93D, for example, is provided on a lower surface of nozzle tray 93 at a portion at which an opening of a loading hole 93A is not formed. With respect to this, multiple pressure switches 99 are provided on loading surface 98A of loading plate 98. The multiple pressure switches 99 are provided at positions opposite protruding sections 93D of nozzle tray 93 in the Z-axis direction. Thus, pressure switches 99 are turned on and off by being pressed by protruding sections 93D of nozzle tray 93 loaded on loading surface 98A. For example, pressure switch 99 is turned on by being pressed by protruding section 93D. Detection signal S1 (refer to FIG. 4) based on the on or off state of pressure switch 99 is sent to controller 102.

The quantity and positions of protruding sections 93D are changed based on the type of nozzle tray 93. Here, types of nozzle tray 93 are, for example, classified based on the height in the Z-axis direction of the nozzle tray 93 including suction nozzles 70, that is, based on a value of the total of height H1 of body pipe 72 of suction nozzle 70 and height H2 of nozzle tray 93 shown in FIG. 3. Thus, controller 102 is able to acquire information of the classification of the height of nozzle tray 93 and suction nozzle 70 based on detection signal S1 of pressure switch 99. Details of control of controller 102 using detection signal S1 are described later.

Figure 4:
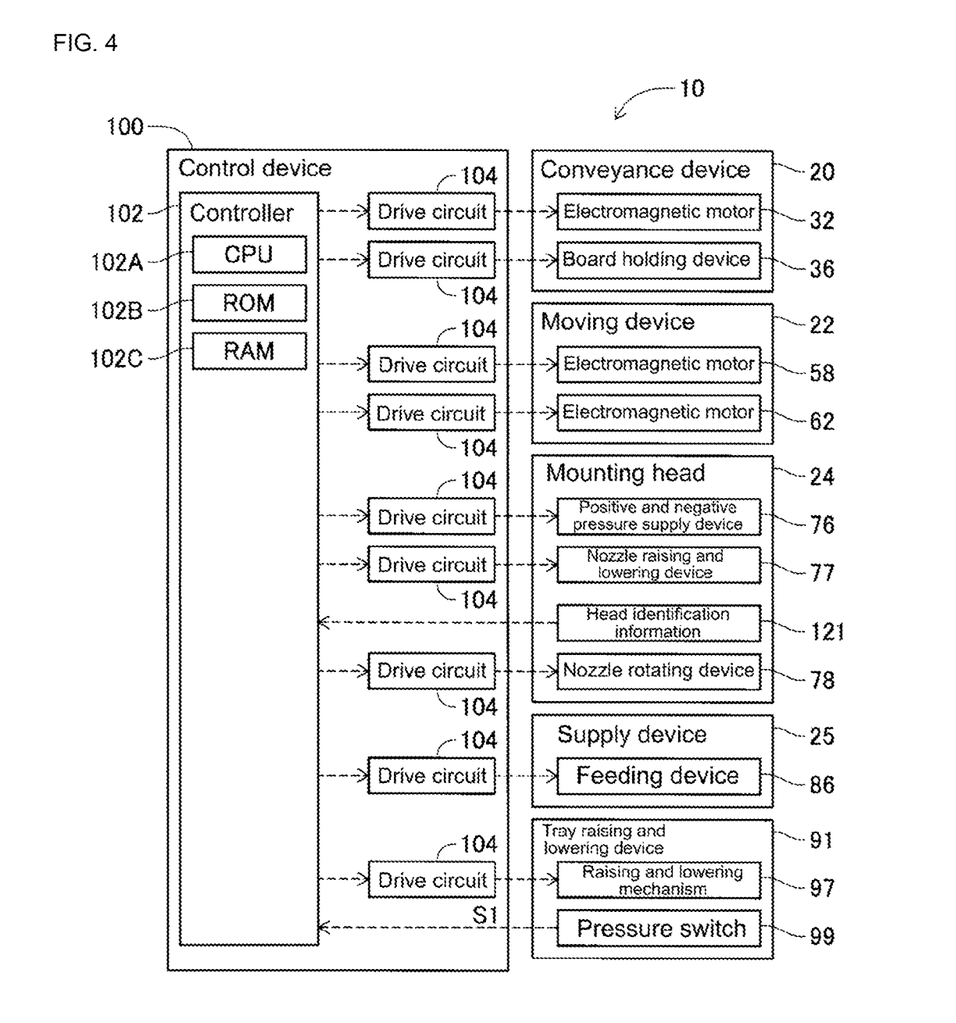
FIG. 4 is a block diagram of a control device of the component mounter.

FIG. 4 shows the electrical configuration of mounter 10. As shown in FIG. 4, mounter 10 includes control device 100. Control device 100 includes controller 102 and multiple drive circuits 104. Controller 102 is connected to the multiple drive circuits 104. The multiple drive circuits 104 are connected to the above electromagnetic motors 32, 58, and 62, board holding device 36, positive and negative pressure supply device 76, nozzle raising and lowering device 77, nozzle rotating device 78, feeding device 86, and raising and lowering mechanism 97. Also, controller 102 is based around a computer provided with CPU 102A, ROM 102B, and RAM 102C. ROM 1026 stores various programs, for example, a program described later for determining whether mounting head 24 and nozzle tray 93 will interfere. CPU 102A executes a program saved on ROM 102B, and controls various devices of mounter 10 via drive circuits 104. ROM 102C, when a program is executed by CPU 102A, is used as working memory. Operations of conveyance device 20 and moving device 22 are controlled by various programs being executed by CPU 102A of controller 102.

Determining Processing by Mounter

Figure 5:
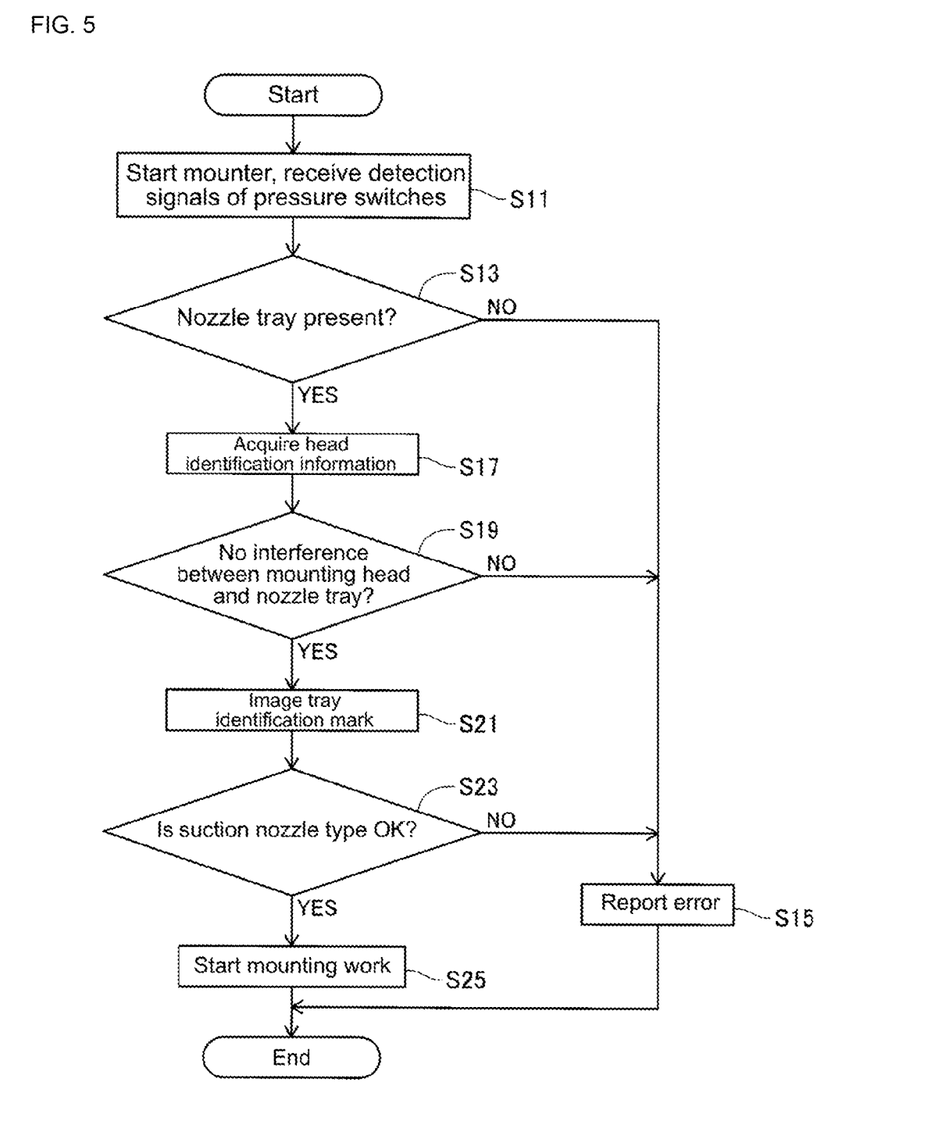
FIG. 5 is a flowchart showing a processing procedure of determination processing that determines whether interference will occur between the nozzle tray and the mounting head.

Next, descriptions are given of processing by controller 102 for determining whether mounting head 24 and nozzle tray 93 will interfere, with reference to the flowchart shown in FIG. 5. FIG. 5 shows an example of processing when controller 102 is started. Note that, interference between mounting head 24 and nozzle tray 93 includes not only direct contact between mounting head 24 and nozzle tray 93, but also, for example, indirect contact such as contact between mounting head 24 and a suction nozzle 70 stored in nozzle tray 93.

First, in step (hereinafter simply referred to as "s") 11 shown in FIG. 5, when the user turns on power to mounter 10, controller 102 supplies power to and starts up each device of mounter 10. Controller 102 receives detection signal S1 from pressure switches 99 of tray raising and lowering device 91.

Next, controller 102 determines whether nozzle tray is loaded based on detection signal S1 of pressure switches 99. For example, controller 102, in a case in which all pressure switches 99 are off based on detection signal S1 (S13: no), determines that nozzle tray 93 is not loaded on loading plate 98. Controller 102 reports the error to the user by displaying an error on a display section (not shown) or sounding an alarm (S15), and determination processing of FIG. 5 ends. Thus, the user, for example, is reminded to load nozzle tray 93 on loading plate 98 and can perform appropriate measures.

On the other hand, controller 102, in a case in which one of the pressure switches 99 among the multiple pressure switches 99 is on based on detection signal S1 (S13: yes), determines that nozzle tray 93 is loaded on loading plate 98.

Next, controller 102 acquires head identification information 121 (refer to FIG. 4) of mounting head 24 (S17). Here, head identification information 121 is information for identifying the type of mounting head 24, for example, information set with a different value for each type of mounting head 24. Head identification information 121, for example, is information that is set in advance on, for example, memory loaded on an internal board of mounting head 24. Controller 102 reads head identification information 121 from mounting head 24 and saves it on RAM 102C (S17).

Next, controller 102 determines whether interference will occur between mounting head 24 and nozzle tray 93 based on head identification information 121 read from mounting head 24 and detection signal S1 of pressure switches 99.

Here, with respect to the work position of board 34, reducing the movement distance of mounting head 24 is linked to a reduction in work time and thus to a reduction in production time for board 34. For example, mounting head 24 is raised and lowered in the Z-axis direction when a suction nozzle 70 is exchanged at nozzle station 28. It is desirable for this movement distance in the Z-axis direction of mounting head 24 to be short. Thus, with mounter 10 of the embodiment, when exchanging a suction nozzle 70, tray raising and lowering device 91 is driven to raise nozzle tray 93, thus shortening the distance in the Z-axis direction that mounting head 24 needs to move.

Figure 6:
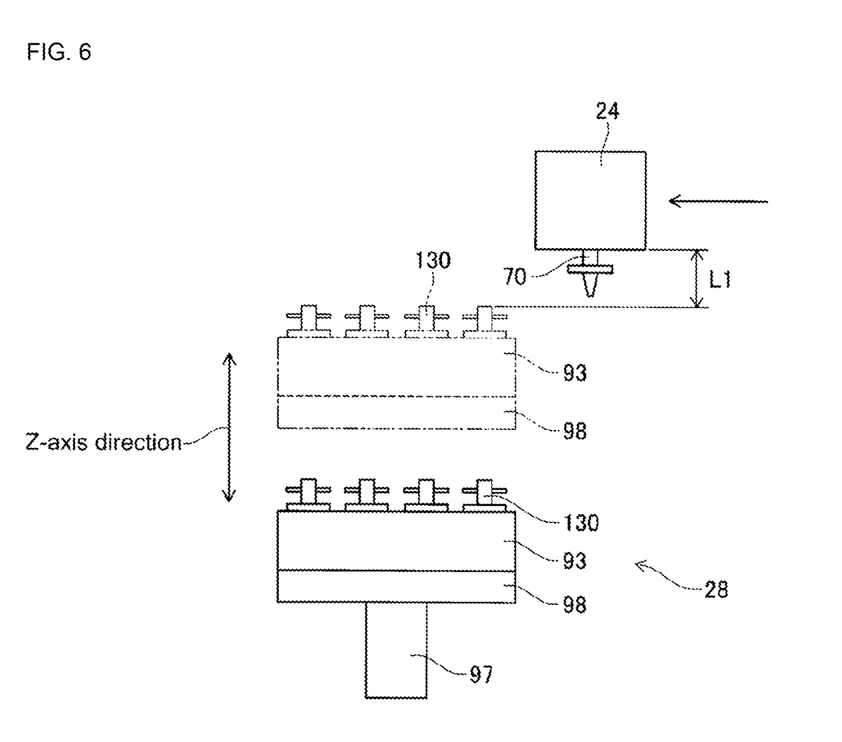
FIG. 6 is a schematic diagram showing a state of a nozzle station and a mounting head during suction nozzle exchange.

FIG. 6 is a schematic diagram showing a state of nozzle station 28 and mounting head 24 during suction nozzle 70 exchange. Note that, for ease of understanding, in descriptions below, suction nozzle 70 stored in nozzle tray 93 is referred to as suction nozzle 130 so as to distinguish it from suction nozzle 70 attached to mounting head 24.

Nozzle tray 93, when exchange of suction nozzle 70 is not being performed, is positioned at the position shown by the solid lines in FIG. 6 (hereinafter referred to as the "retract position") so as to not interfere with movement of mounting head 24 and the like. Nozzle tray 93 in the retract position is at a position separated from mounting head 24 in the Z-axis direction (vertical direction).

Also, controller 102, in coordination with the starting of exchange processing of suction nozzle 70, drives raising and lowering mechanism 97 so as to raise nozzle tray 93 to the position shown by the two-dashed lines of FIG. 6 (hereinafter referred to as "exchange position"). Nozzle tray 93 in the exchange position is at a position closer to mounting head 24 in the Z-axis direction compared to the retract position. By this, distance L1 in the Z-axis direction between mounting head 24 moved above nozzle station 28 and suction nozzle 70 in nozzle tray 93 is shortened. Distance L1 is the distance that mounting head 24 needs to be raised and lowered to exchange suction nozzle 70 for suction nozzle 130. Accordingly, by raising nozzle tray 93 to shorten the distance L1 that mounting head 24 is raised and lowered, the time required to exchange suction nozzle 70 is reduced. Note that, in the example shown in FIG. 6, controller 102 performs control to raise nozzle tray 93 from the retract position to an exchange position that is one level higher, but the configuration is not limited to this. For example, controller 102 may perform control to raise nozzle tray 93 to various levels of exchange positions at different heights. Accordingly, controller 102, depending on the size and so on of mounting head 24, optimizes the height of the exchange position of nozzle tray 92 so as to shorten the time required for exchange work.

On the other hand, for example, various types of mounting heads 24, suction nozzles 70, and nozzle trays 93 are being developed with improvements that add new functions. The length of a mounting head 24 in the Z-axis direction may be increased due to such improvements. With nozzle station 28 of the embodiment, for example, a position at which interference does not occur with the lower end of a mounting head 24 for which a dimension in the Z-axis direction is the longest is set in advance as the exchange position. However, it may be difficult to adjust the height of the exchange position whenever there is a change to the shape and so on of mounting head 24 or nozzle tray 93.

Figure 7:
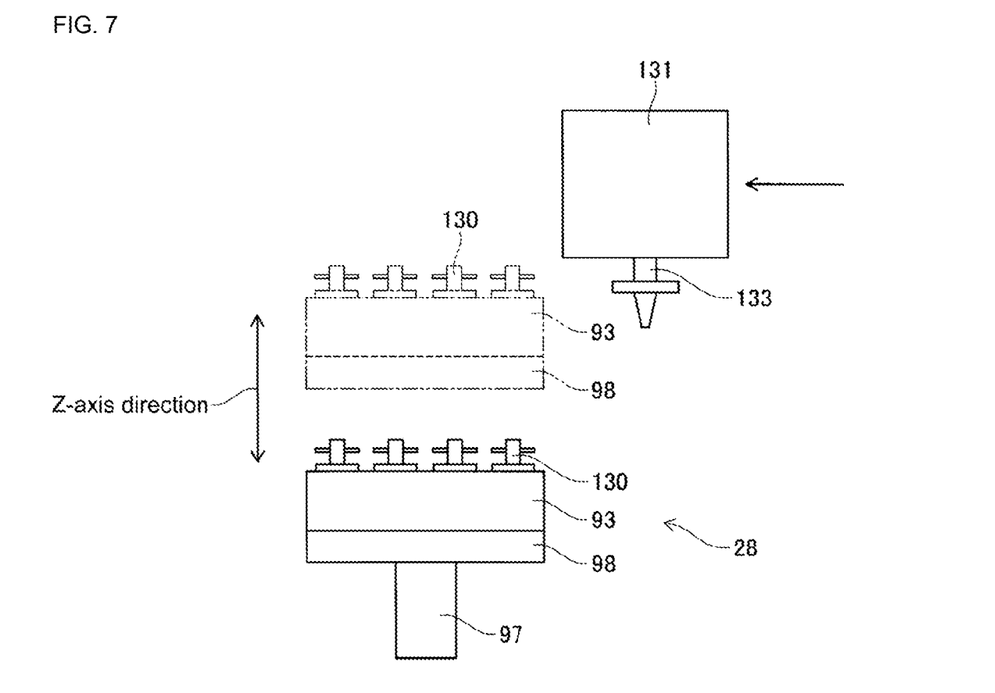
FIG. 7 is a conceptual diagram in a case of a mounting head with a different size to that in FIG. 6.

As a result, for example, as shown in FIG. 7, when mounting head 131 with a longer dimension in the Z-axis direction than mounting head 24 is attached and moved to nozzle station 28, mounting head 131 may contact and interfere with nozzle tray 93. Similarly, when suction nozzle 133 with a longer dimension in the Z-axis direction than suction nozzle 70 shown in FIG. 6 is attached, suction nozzle 133 may contact and interfere with nozzle tray 93 when mounting head 24 is moved. Similarly, when nozzle tray 93 with a longer dimension in the Z-axis direction than nozzle tray 93 shown in FIG. 6 is loaded on loading plate 98, nozzle tray 93 may contact and interfere with mounting head 24 moved to nozzle station 28. Thus, in a case in which an incorrect combination of mounting head 24 and nozzle tray 93 is used, mounting head 24 may interfere with nozzle tray 93 or the like. Therefore, it is necessary for controller 102 to determine whether the combination of mounting head 24 and nozzle tray 93 is correct, that is, whether interference may occur.

Tray identification mark 93C (refer to FIG. 3) for identifying nozzle tray 93 is provided on nozzle tray 93. It may be considered to determine whether mounting head 24 will interfere with nozzle tray 93 using tray identification mark 93C. However, because interference will occur before mounting head 24 is moved above nozzle tray 93, it is difficult to image tray identification mark 93C using mark camera 27. Accordingly, controller 102 must determine whether mounting head 24 and nozzle tray 93 will interfere with each other before actually moving mounting head 24 above nozzle station 28.

For this, protruding section 93D is provided on nozzle tray 93 of the embodiment in accordance with the height in the Z-axis direction. Nozzle tray 93, for example, includes multiple protruding sections 93D that differ based on classifications of height H2 of nozzle tray 93 (refer to FIG. 3) and height H1 of suction nozzle 130 stored in nozzle tray 93 (refer to FIG. 3). Also, pressure switches 99 that are pressed by protruding sections 93D are provided on loading plate 98 of tray raising and lowering device 91. Controller 102 receives detection signal S1 based on the on and off states of pressure switches 99.

Returning to FIG. 5, controller 102, in S19, determines whether interference will occur between mounting head 24 and nozzle tray 93 based on detection signal S1 and head identification information 121 of mounting head 24. For example, a database is saved in ROM 102B of controller 102 of combinations of mounting heads 24 and nozzle trays 93 and values indicating whether interference will occur for those combinations. Controller 102 is able to determine whether interference will occur by searching the database for the combination that was actually detected.

Controller 102, if determining in S19 that interference may occur (S19: no), reports an error to a user (S15), and processing of FIG. 5 ends. Thus, it is possible to prevent interference between mounting head 24 and nozzle tray 93. Also, because the user recognizes the error, it is possible to change to an appropriate type of mounting head 24 or nozzle tray 93.

Also, controller 102, in a case of determining that interference will not occur between mounting head 24 and nozzle tray 93 (S19: yes), determines the type of suction nozzle 70 stored in nozzle tray 93 based on information of tray identification mark 93C of nozzle tray 93 (S21, S23). Controller 102 drives raising and lowering mechanism 97 to raise nozzle tray 93 from the retract position to the exchange position. Controller 102 moves mounting head 24 above nozzle station 28 and images tray identification mark 93C using mark camera 27 (S21).

Controller 102 image processes the image data captured by mark camera 27 and detects tray identification mark 93C. Further, controller 102 drives raising and lowering mechanism 97 to lower nozzle tray 93 from the exchange position to the retract position. Controller 102 determines the type of suction nozzle 70 stored in nozzle tray 93 based on the detected information of tray identification mark 93C.

Controller 102, for example, in a case of determining in S23 that a suction nozzle 70 required for picking up components to be mounted during the mounting work (S25) of the next board to be produced is not stored in nozzle tray 93 (S23: no), reports an error to the user and ends processing shown in FIG. 5. Also, because the user recognizes the error, it is possible to change the suction nozzle 70 stored in nozzle tray 93 to an appropriate suction nozzle.

Also, controller 102, in a case of determining in S23 that suction nozzles 70 required for mounting work (S25) are stored in nozzle tray 93 (S23: yes), uses mounting head 24 to start mounting work with respect to board 34 held by conveyance device 20 (S25). Specifically, controller 102 drives electromagnetic motors 32 and the like to convey board 34 to the work position. Controller 102 drives board holding device 36 such that board 34 is fixedly held at the work position. Controller 102 moves mounting head 24 above board 34 and images board 34 using mark camera 27. By this, controller 102 image processes image data acquired by mark camera 27 and acquires the error and the like of the holding position of board 34. Also, controller 102 drives tape feeder 85 to feed taped components so as to supply a component to the supply position. Controller 102 moves mounting head 24 to the component supply position and picks up and holds the component using suction nozzle 70. Controller 102 moves mounting head 24 above component camera 26 and images the component held by suction nozzle 70 using component camera 26. By this, controller 102 acquires an error and the like of the holding position of the component. Then, controller 102 moves mounting head 24 above board 34, corrects for the error in the holding position of board 34 and for the error and the like in the holding position of the component, and mounts the component held by mounting head 24 on board 34.

Also, controller 102, in a case such as when the type of board 34 being produced changes after starting the above mounting work, exchanges suction nozzle 70 on mounting head 24 with suction nozzle 130 in nozzle station 28 as required. Controller 102 drives raising and lowering mechanism 97 to raise nozzle tray 93 from the retract position to the exchange position. Controller 102 moves mounting head 24 above nozzle station 28.

Controller 102 is able to detect the position and so on of suction nozzle 130 that is to be used for exchange by determining based on imaging by mark camera 27 of nozzle identification mark 70A provided on suction nozzle 130 of nozzle tray 93. Controller 102 performs control to exchange suction nozzle 130 that is in the position detected as the target to be used for exchange with suction nozzle 70 on mounting head 24. In this manner, mounter 10 of the embodiment is able to perform exchange of suction nozzle 70 while preventing interference between mounting head 24 and nozzle tray 93 and the like.

Note that, tray identification mark 93C is information required for individually identifying nozzle tray 93, that is, information required for identifying the type of nozzle tray 93. On the other hand, information for identifying based on detection signal S1 of pressure switches 99 is, for example, information that groups nozzle trays 93 based on heights H1 and H2 (refer to FIG. 3), and is not necessarily information detailed enough to identify the type of or individual nozzle tray 93. Thus, the level of information that can be acquired from pressure switches 99 is smaller compared to the level of information that can be acquired from tray identification mark 93C. Accordingly, to decrease manufacturing costs, it is desirable to make the quantity of pressure switches the minimum required for grouping nozzle trays 93 and suction nozzles 130 by height.

Note that, mark camera 27 of the embodiment is an example of an imaging section. Suction nozzle 70 is an example of a component holding section. Nozzle tray 93 is an example of a storage section. Tray identification mark 93C is an example of an identification mark. Loading plate 98 is an example of a base section. Pressure switch 99 is an example of a detection section. Tray raising and lowering device 91 is an example of a raising and lowering section. Control device 100 is an example of a control device. Suction nozzle 130 is an example of an exchange-use component holding section.

The following effects are achieved by the above embodiments. Head identification information 121 for identifying the type of mounting head 24 is provided on mounting head 24 of the embodiment. Controller 102 of mounter 10, for example, reads head identification information 121 from mounting head 24 during startup. Also, different quantities of protruding sections 93D are formed on nozzle tray 93 in accordance with the height in the Z-axis direction. Pressure switches 99 of loading plate 98 are turned on and off by being pressed by protruding sections 93D. By this, controller 102 is able to detect information related to the height of nozzle tray 93 as soon as nozzle tray 93 is loaded on loading plate 98 based on detection signal S1 of pressure switches 99. That is, controller 102 is able to detect information related to the height of nozzle tray 93 before mounting head 24 is moved to nozzle station 28 for exchange of suction nozzle 70. As a result, controller 102 is able to determine whether interference will occur between mounting head 24 and nozzle tray 93 based on detection signal S1 of pressure switches 99 and head identification information 121.

Also, mounter 10 is provided with control device 10 that determines whether interference will occur between mounting head 24 and nozzle tray 93 based on detection signal S1 of pressure switches 99 and head identification information 121. By this, mounter 10, by controlling operation of mounting head 24 in accordance with the determination result of control device 100, is able to determine whether interference will occur inside the machine and perform appropriate measures without requiring instructions from an external device.

Also, controller 102 reports an error to the user (S15) in a case in which it is determined that interference will occur between mounting head 24 and nozzle tray 93 (S19: no). Thus, it is possible to prevent interference between mounting head 24 and nozzle tray 93.

Also, controller 102 starts mounting work (S25) in a case in which it is determined that interference will not occur between mounting head 24 and nozzle tray 93 (S19: yes). By this, it is possible to improve production efficiency by continuing mounting work while appropriately exchanging suction nozzles 70 without interference occurring between suction nozzle 70 and nozzle tray 93.

Controller 102 moves mounting head 24 above nozzle station 28 when exchanging suction nozzles 70, and images tray identification mark 93C of nozzle tray 93 using mark camera 27. Controller 102 image processes the image data captured by mark camera 27 and detects tray identification mark 93C. Controller 102 determines the type of suction nozzle 70 stored in nozzle tray 93 based on tray identification mark 93C. Accordingly, controller 102 is able to acquire information in accordance with the height of nozzle tray 93 or the like and determine whether interference will occur without moving head 24 above nozzle station 28. Continuing, controller 102 moves mounting head 24 after detecting that interference will not occur, and then images tray identification mark 93C using mark camera 27 to acquire the type of suction nozzle 70. That is, controller 102 first determines whether interference will occur using the relatively simple configuration of pressure switches 99, and then acquires more detailed information regarding nozzle tray 93 using mark camera 27 after detecting that interference will not occur.

Also, different quantities of protruding sections 93D are formed on nozzle tray 93 in accordance with the height in the Z-axis direction. Pressure switches 99 of loading plate 98 are turned on and off by being pressed by protruding sections 93D. With such a configuration, it is possible to reduce costs by have a detection section for detecting information in accordance with the height of nozzle tray 93 or the like with a simple configuration.

Controller 102 controls tray raising and lowering device 91 to raise and lower nozzle tray 93 to and from the retract position and the exchange position. By this, controller 102 is able to prevent interference with mounting head 24 during mounting work by moving nozzle tray 93 to the retract position while not performing exchange of a suction nozzle 70. Also, controller 102, when performing exchange of a suction nozzle 70, by raising nozzle tray 93 to the exchange position in advance before moving mounting head 24 above nozzle station 28, is able to shorten the time required for exchange by shortening the distance the mounting head 24 needs to be lowered during exchange work of suction nozzle 70.

Further, the present disclosure is not limited to the above example embodiments, and various changed or improved methods of embodiment are possible based on the knowledge of someone skilled in the art. Also, in the embodiment above, pressure switch 99 is used as the detection section, but the configuration is not limited to this. For example, loading plate 98 may be provided with electrical contacts on loading surface 98A as a detection section. With respect to this, nozzle tray 93 may be provided with multiple metal plates of different heights on a lower section. With such a configuration, controller 102 is able to detect information in accordance with the height of nozzle tray 93 based on whether the terminals provided on loading surface 98A are conducting electricity.

Also, in the above embodiment, the contents and order of the flowchart shown in FIG. 5 are an example and may be changed appropriately. For example, controller 102 performs determination processing for whether interference will occur during startup of mounter 10, but the timing is not limited to this. Controller 102 may perform determination processing for whether interference will occur after exchange of mounting head 24, exchange of nozzle tray 93, or the like.

Also, in the above embodiment, controller 102 determines the type of suction nozzle 70 stored in nozzle tray 93 based on information of tray identification mark 93C, but the configuration is not limited to this, and the type of nozzle tray 93 may be determined, or both the type of nozzle tray 93 and the type of suction nozzle 70 stored in the nozzle tray 93 may be determined. Also, mounter 10 does not have to be provided with tray raising and lowering device 91 that raises and lowers nozzle tray 93. Further, nozzle tray 93 does not have to be provided with tray identification mark 93C.

REFERENCE SIGNS LIST

10: mounter; 24, 131: mounting head; 27: mark camera (imaging section); 34: board; 70: suction nozzle (component holding section); 91: tray raising and lowering device (raising and lowering section); 93: nozzle tray (storage section); 93C: tray identification mark (identification mark); 93D: protruding section; 98: loading plate (base section); 99: pressure switch (detection section); 100: control device (control section); 121: head identification information; 130: suction nozzle (exchange-use component holding tool)

The invention claimed is:

1. A mounter comprising:
    a mounting head configured to mount components on a board;
    head identification information provided on the mounting head, the head identification information being for identifying a type of the mounting head;
    a component holding section configured to hold the component and exchangeably attached to the mounting head;
    a storage section configured to store an exchange-use component holding section;
    a base section on which the storage section is removably loaded; and
    a detection section configured to detect information in accordance with a height of at least one of the exchange-use component holding section and the storage section loaded on the base section, wherein
    the storage section includes a protruding section with a form that differs depending on a height of at least one of the storage section and the exchange-use component holding section stored in the storage section, and
    the detection section is a pressure switch configured to be pressed by the protruding section of the storage section loaded on the base.

2. The mounter according to claim 1, including
    a control section configured to determine whether the mounting head and the storage section will interfere based on the head identification information and a detection result of the detection section, and control operation of the mounting head in accordance with a result of the determination.

3. The mounter according to claim 2, wherein
    the control section is configured to, in a case of determining that the mounting head and the storage section will interfere, prohibit operation of moving the mounting head to the storage section to exchange the component holding section.

4. The mounter according to claim 2, wherein
    the control section is configured to, in a case of determining that the mounting head and the storage section will not interfere, move the mounting head to the storage section and exchange the component holding section with the exchange-use component holding section.

5. The mounter according to claim 1, wherein
    the mounting head includes an imaging section,
    the storage section includes an identification mark for identifying a type of the storage section, and
    further provided is a control section configured to control the mounting head such that the identification mark is imaged by the imaging section, and identify the type of the storage section based on the identification mark that was imaged.

6. The mounter according to claim 1, including
    a raising and lowering section configured to raise and lower the storage section to and from a retract position separated from the mounting head in a vertical direction, and an exchange position that is raised from the retract position towards the mounting head and at which the component holding section is exchanged with the exchange-use component holding section.

* * * * *